United States Patent [19]

Nakata

[11] 4,196,361
[45] Apr. 1, 1980

[54] TEMPERATURE CHANGE DETECTOR

[75] Inventor: Jōsuke Nakata, Itami, Japan

[73] Assignee: Mitsubishi Denki Kabushiki Kaisha, Tokyo, Japan

[21] Appl. No.: 822,549

[22] Filed: Aug. 8, 1977

[51] Int. Cl.² .............................................. H03K 3/26
[52] U.S. Cl. ................................ 307/310; 307/252 A; 307/308; 361/103
[58] Field of Search ................... 307/308, 310; 357/28; 361/103

[56] References Cited

U.S. PATENT DOCUMENTS

| | | | |
|---|---|---|---|
| 3,708,720 | 1/1973 | Whitney et al. ....................... | 307/310 |
| 3,959,621 | 5/1976 | Nakada ..................................... | 357/28 |

OTHER PUBLICATIONS

IBM Tech. Disclre. Buttn., Transistor with Small Temperature Dependence by E. F. Map, vol. 4, No. 10, 3/63.

New Design Ideas from SSPI, Temperature Control Static Switching, 1 sheet, 11/21/61.

Primary Examiner—Stanley D. Miller, Jr.
Assistant Examiner—B. P. Davis
Attorney, Agent, or Firm—Oblon, Fisher, Spivak, McClelland & Maier

[57] ABSTRACT

A temperature change detector comprising a heat sensitive semiconductor switching device (heat sensitive thyristor) and which switches when a temperature of an element whose temperature is to be detected is changed by a specific value with respect to the ambient temperature.

A variable impedance element such as a thermistor or a diode whose resistance is varied depending upon the ambient temperature is connected between the P gate terminal and the cathode terminal of the heat sensitive thyristor which is thermally coupled to the element whose temperature is to be detected, whereby the effect of the ambient temperature on the switching temperature characteristic of the heat sensitive thyristor is compensated.

5 Claims, 6 Drawing Figures (B)

TEMPERATURE CHANGE DETECTOR

DESCRIPTION OF THE PRIOR ARTS

The heat sensitive semiconductor switching element having PNPN junction has been disclosed in U.S. Pat. No. 4,009,482, West German Pat. No. 2,446,104 and Canadian Pat. No. 1,005,926 which are filed by the same applicant.

The breakover phenomenon of the thermal effect which had been troublesome in a thyristor has been effectively used to provide the novel type heat sensitive switching device.

The heat sensitive thyristor has characteristics to decide the temperature at which it is switched from an OFF state to an ON state when the forward voltage and the gate condition are constant whereby it can be used for detecting the absolute value of the temperature as described in said patents.

However, it is necessary to compensate for the effect of variation of the ambient temperature for usages switching the heat sensitive thyristor by detecting the temperature rise of the element whose temperature is detected in the thermal coupling of the heat sensitive thyristor to the element.

When the self heat generation caused by current passing through the heat sensitive thyristor is small, the temperature of the heat sensitive thyristor is the sum of the ambient temperature and the temperature rise of the element, whereby it is difficult to switch the heat sensitive thyristor by precisely detecting the temperature rise of the element without maintaining the ambient temperature of the heat sensitive thyristor constant.

SUMMARY OF THE INVENTION

It is an object of the present invention to provide a novel temperature change detector which comprises a heat sensitive semiconductor switching device such as a heat sensitive thyristor which is thermally coupled to a specific element whose temperature is detected whereby the effect of the ambient temperature is compensated to detect the true temperature change of the element.

It is another object of the present invention to provide a temperature change detector which has simple structure and economical and can be used relatively wide fields.

DETAILED DESCRIPTION OF THE PREFERRED EMBODIMENTS

Figure 1:
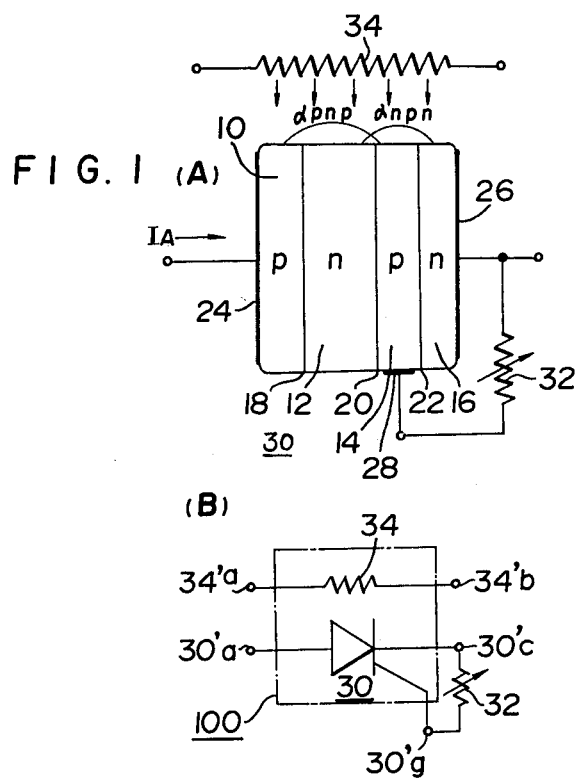
FIG. 1(A) is a schematic view of the conventional heat sensitive thyristor.
FIG. 1(B) is an equivalent circuit diagram of FIG. 1(A)

FIG. 1(A) is a schematic view of the heat sensitive thyristor (30) wherein the reference numeral (10) designates a P type emitter layer; (12) designates a N type base layer; (14) designates a P type base layer; (16) designates a N type emitter; (18), (20), (22) respectively designate the first, second and third PN junctions; (24) designates an anode; (26) designates a cathode; (28) designates a gate electrode; (32) designates a control resistor and (34) designates an element whose temperature is detected (heat source) disposed near the heat sensitive thyristor (30).

FIG. 1(B) is an equivalent circuit diagram of the indirectly heated heat sensitive thyristor (100) which is thermally coupled to the heat sensitive thyristor (30) and the heat source (heater) (34). The heat sensitive thyristor (30) can have a five layer structure of PNPNP (or NPNPN) as well as a four layer structure of PNPN.

Figure 2:
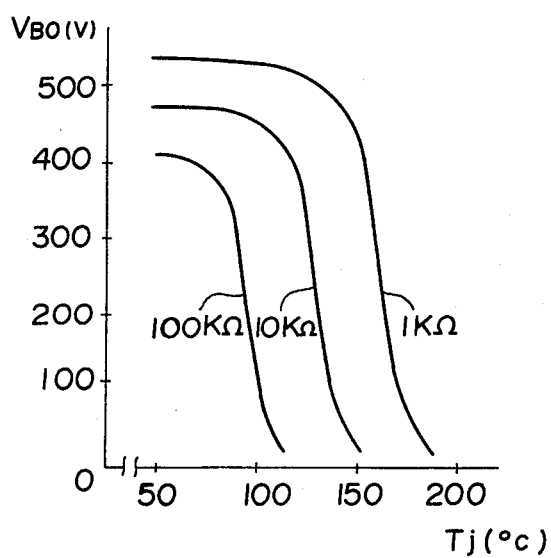
FIG. 2 shows temperature characteristic curves of the heat sensitive thyristor of FIG. 1.

FIG. 2 shows the temperature characteristics of the heat sensitive thyristor, which shows the relationship of the breakover voltage $V_{bo}$ of the heat sensitive thyristor (10) and the temperature $T_j$ of the heat sensitive thyristor when the resistance of the control resistor (7) is 1 KΩ, 10 KΩ or 100 KΩ.

From the results of FIG. 2, it is clear that when the temperature $T_j$ is increased at the constant resistance of the control resistor, the breakover voltage $V_{bo}$ is remarkably lowered.

The embodiment of the present invention will be illustrated with the principle characteristics of the heat sensitive thyristors.

Figure 3:
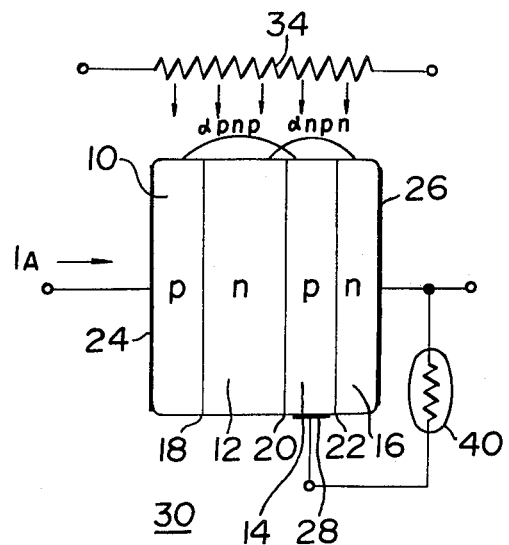
FIG. 3 is a schematic view of one embodiment of a temperature change detector of the present invention.
Figure 4:
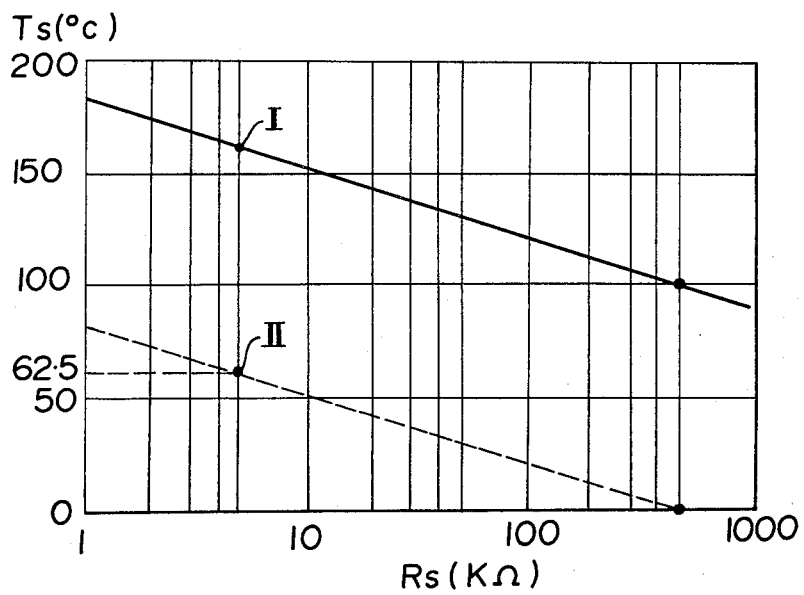
FIG. 4 shows characteristic curves for illustrating principle of compensation of effect of the ambient temperature in the temperature change detector of the present invention.

FIG. 3 is a schematic view of one embodiment of the present invention. The thermistor (40) having the resistance-temperature characteristic shown by the dotted line II of FIG. 4 is used as the control resistance $R_s$. The ambient temperature of the heat sensitive thyristor (30) is detected by the thermistor whereby it is switched at the specific value of the temperature rise of the heat source (4) even though the ambient temperature is changed.

FIG. 4 shows characteristic curves for illustrating the principle of compensation of the ambient temperature by the thermistor wherein the switching temperature $T_s$ (°C.) is plotted on the ordinate axis and the resistance of the control resistor is plotted on the abscissa a in logarithmic scale $R_s$ (KΩ).

In FIG. 4, the full line (I) shows the switching temperature Thd s at which the heat sensitive thyristor (30) is turned on when the voltage 10 V is applied between the anode (24) and the cathode (26) of the heat sensitive thyristor (30) versus the resistance $R_s$ of the control resistor (32).

In the range of the resistance $R_s$ of 1 KΩ to 500 KΩ, the switching temperature $T_s$ is varied in substantially reverse proportion to the logarithmic scale of the resistance.

In the embodiment of the present invention, as shown in the dotted line (II), the thermistor having the resistance-temperature characteristics of gradient of the full line (I) is used. The ambient temperature of the heat sensitive thyristor (10) is detected by the thermistor, whereby the temperature rise of the heat source is switched at the specific value even though the ambient temperature is changed.

In FIG. 4, when the resistance $R_s$ of the thermistor at the ambient temperature of 0° C. is about 500 KΩ, the switching temperature $T_s$ of the heat sensitive thyristor (10) is about 100° C. as it is clear from the full line (I).

When the ambient temperature is about 62.5° C., the resistance of the thermistor is about 5 KΩ as shown by the dotted line (II). The switching temperature of the heat sensitive thyristor (10) is about 162.5° C. That is, even though the ambient temperature is changed, the heat sensitive thyristor (10) can be always switched at the temperature of about 100° C. higher than the ambient temperature.

The temperature change value to be detached (100° C.) can be set as desired by selecting the resistance at the specific temperature.

In the other embodiment of the present invention, the effect of the ambient temperature can be compensated by connecting the PN diode for compensation of ambient temperature between the cathode terminal of the heat sensitive thyristor (10) and the control terminal (13). In this case, the cathode terminal of the heat sensitive thyristor is connected to the N terminal of the PN diode for compensation of ambient temperature. In the voltage-current characteristics (V-I characteristics) of the PN diode for compensation of ambient temperature as shown in FIG. 4, the equivalent resistance is lowered at the same voltage by raising the temperature $T_a$. This fact shows that in a certain temperature range, the V-I characteristic curve has the same gradient as the temperature characteristic curve (I) of the heat sensitive thyristor shown in FIG. 3. That is, the change of the ambient temperature can be compensated.

Figure 5:
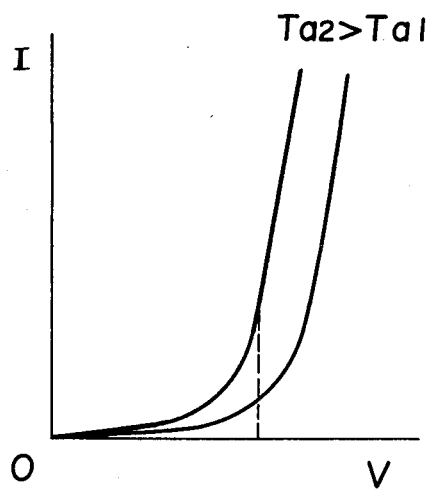
FIG. 5 shows V-I characteristic curves of PN diode for compensation.

FIG. 5 is a schematic view of the embodiment wherein the V-I characteristic of the PN diode for compensation of ambient temperature is selected from the similar V-I characteristics in the PN region adjacent to the control terminal (13) and the cathode terminal (12) of the heat sensitive thyristor (10).

The heat sensitive thyristor (10) is disposed so as to thermally couple to the heat source. The PN diode for temperature compensation is disposed to be separated from the heat source so as to be affected by only the ambient temperature $T_a$.

Figure 6:
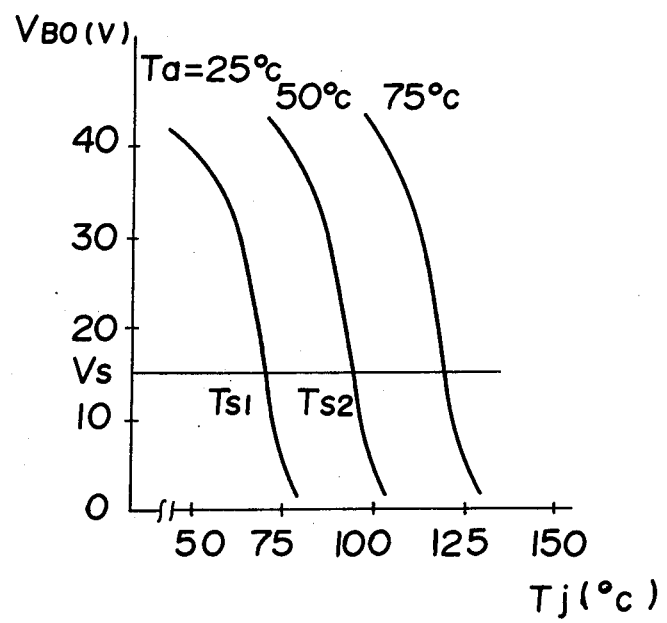
FIG. 6 shows temperature characteristic curves of a heat sensitive thyristor when the PN diode for compensation is used.

The relationship of the breakover voltage $V_{bo}$ and the temperature $T_j$ of the heat sensitive thyristor (10) is shown in FIG. 6 as the parameter of the ambient temperature $T_a$ of the PN diode for temperature compensation. The terminal voltage $V_s$ of the heat sensitive thyristor is 15 V, whereby the switching temperature $T_{s1}$ of the heat sensitive thyristor at the ambient temperature of 25° C. is 70° C. When the ambient temperature $T_a$ is 50° C., the switching temperature $T_{s2}$ is 95° C. That is, the switching temperature increases for 25° C. by raising the ambient temperature for 25° C., whereby the temperature rise detecting value of 50° C. is not changed.

In the above-mentioned description, the heat sensitive thyristor is considered as the heat sensitive semiconductor switching device. Thus, it is possible to use the heat sensitive semiconductor switching device formed by connecting an equivalent PNP transistor and an NPN transistor.

The thermistor-diode has been used as the variable impedance element for varying the impedance depending upon the ambient temperature. Thus, it is possible to use the other elements which compensate the effect of the ambient temperature to the switching temperature characteristic of the heat sensitive semiconductor switching device by the variable impedance characteristic to the ambient temperature.

As described by the two embodiments, in accordance with the present invention, the heat sensitive semiconductor switching device is thermally coupled to the element whose temperature is detected such as a motor, a transformer and a heater etc. whereby the effect of the change of the ambient temperature is compensated by the variable impedance element connected to the control terminal. The temperature change of the element whose temperature is detected, can be detected regardless of the change of the ambient temperature. The temperature change detector of the present invention can be widely applied for various control circuits and the industrial value is remarkably high.

The temperature change detector of the present invention can be also applied for the usage controlling the temperature difference between two substrates or two spaces, to be constant, such as as an air-conditioner and a simple power meter.

What is claimed is:

1. A temperature change detector which comprises:
   a heat sensitive semiconductor switching device thermally coupled with an element whose change in temperature is to be detected and including at least one pair of main electrode terminal and a control electrode terminal, the switching device being suddenly switched from a high impedance state to a low impedance state when heated to a switching temperature $T_s$ by a change in temperature of the element whose temperature change is to be detected; and
   a variable impedance element connected between one of the main electrode terminals of the heat sensitive semiconductor switching device and the control electrode terminal for compensating for changes ΔT in ambient temperature of the switching device by changing the switching temperature $T_s$ of the switching device by an equal amount ΔT, the value of the impedance of the variable impedance element being varied by changes 66 T in ambient temperature of the switching device, and the value of the switching temperature $T_s$ of the switching device being controlled by the value of the impedance of the variable impedance element to change by an equal amount ΔT, whereby the temperature change of the element whose change in temperature is to be detected can be detected without maintaining constant the ambient temperature of the heat sensitive semiconductor switching device.

2. A temperature change detector according to claim 1 wherein the heat sensitive semiconductor switching device has at least four semiconductor layers having alternatively different conductive types.

3. A temperature change detector according to claim 1 wherein the heat sensitive semiconductor switching device is formed by a PNP transistor and a NPN transistor.

4. A temperature change detector according to claim 1 wherein the variable impedance element is a thermistor.

5. A temperature change detector according to claim 1 wherein the variable impedance element is a PN diode.